(12) United States Patent
Zimmerman et al.

(10) Patent No.: US 6,823,274 B2
(45) Date of Patent: Nov. 23, 2004

(54) APPARATUS AND METHOD FOR TESTING REMAINING CAPACITY OF A BATTERY

(75) Inventors: Phillip David Zimmerman, Cincinnati, OH (US); David Eric Zimmerman, Cincinnati, OH (US); Gary Lee Claypoole, West Chester, OH (US)

(73) Assignee: ZTS, Inc., Cincinnati, OH (US)

( * ) Notice: Subject to any disclaimer, the term of this patent is extended or adjusted under 35 U.S.C. 154(b) by 76 days.

(21) Appl. No.: 10/291,008

(22) Filed: Nov. 8, 2002

(65) Prior Publication Data

US 2003/0088376 A1 May 8, 2003

Related U.S. Application Data

(63) Continuation-in-part of application No. 09/290,748, filed on Apr. 13, 1999, now abandoned.

(51) Int. Cl.$^7$ .......................... G01R 31/36; G06F 19/00
(52) U.S. Cl. .............................. 702/63; 702/64; 702/65; 702/79; 320/125; 320/136
(58) Field of Search ............................. 702/57, 63, 64, 702/65, 79, 117, 182–184; 320/106, 110, 125, 135, 136, 139; 324/426, 427

(56) References Cited

U.S. PATENT DOCUMENTS

| | | | |
|---|---|---|---|
| 5,376,887 A | 12/1994 | Saubolle | 324/433 |
| 5,990,664 A | * 11/1999 | Rahman | 320/136 |
| 6,061,639 A | * 5/2000 | Wistrand | 702/63 |
| 6,154,011 A | * 11/2000 | Lam et al. | 320/139 |
| 6,313,609 B1 | * 11/2001 | Brink | 320/132 |

* cited by examiner

*Primary Examiner*—Bryan Bui
(74) *Attorney, Agent, or Firm*—James P. Davidson, Esq.

(57) ABSTRACT

An apparatus and method of determining remaining capacity in a battery, including the following steps: detecting the presence of a battery within one of a plurality of specified terminals; automatically initiating a timed pulse load test on the battery upon detection in a terminal; continuously passing current from the battery through a specified resistive load for the terminal; measuring a voltage of the battery while under the resistive load; comparing the measured voltage to a discharge voltage profile of the battery; and, computing the measured voltage as a percent of remaining battery capacity.

30 Claims, 5 Drawing Sheets

APPARATUS AND METHOD FOR TESTING REMAINING CAPACITY OF A BATTERY

CROSS-REFERENCE TO RELATED APPLICATION

The present application is a Continuation-In-Part application to a parent application entitled "Multi-Battery Tester," filed Apr. 13, 1999 now abandoned and having Ser. No. 09/290,748.

BACKGROUND OF THE INVENTION

The present invention relates generally to determining the remaining capacity of batteries or electrochemical cells of various chemistries and, more particularly, to determining the remaining capacity of batteries by measuring the voltage of different battery types and sizes under precise resistive pulse loads.

In the past, conventional battery testers were devices that would indicate the voltage of a battery subjected to a relatively small resistive load. The size or value of that resistive load might be varied depending on the type or size of the battery being tested. More complex testers may compare a battery's voltage under load to fixed voltages along a resistance ladder, where those voltage values correspond to specific levels of remaining charge.

One deficiency of conventional battery testers is that accurate test results are often limited to a specific battery type or chemistry. This occurs because newer battery types or chemistries have significantly different discharge voltage profiles than earlier types. For example, the newer various lithium chemistries often have a relatively flat discharge profile wherein their open circuit voltage (OCV) remains nearly constant from 100% capacity to 20% remaining capacity. Alternately, the discharge profile for alkaline chemistries is a linear slope wherein their OCV decreases proportionately to remaining capacity. Generally, equally discharged batteries of identical voltage ratings, but different chemistries, will produce different results when compared to voltages along a fixed resistance ladder.

Another source of test result error with conventional battery testers is the amount of resistive load applied during the test. Many battery applications today are in electronic devices requiring relatively high power or having high momentary power demands. Examples include cameras with flash, digital cameras, and communication devices. These devices often have battery monitor circuits which will inhibit operation below a specific supply voltage. For accuracy, a battery tester must apply a load that is similar in magnitude and duration to that of typical applications for the battery.

Accordingly, it would be desirable for an electronic circuit to be developed which can accurately determine the remaining capacity of batteries of various chemistries and sizes by measuring their voltage under precise current loads. These current loads are similar to those experienced by the batteries under their normal operating conditions.

It would also be desirable for an electronic circuit to be developed that can be programmed with software algorithms which can be altered to suit a variety of battery testing applications, such as consumer, medical, military, communication or photographic. It is understood that such software could be written for batteries of different sizes and chemistries, as well as for primary and secondary cells.

It is also desirable that the electronic circuit automatically perform a precise pulse load test which will not harm the battery under test. The duration and repetition of this load test cycle may vary depending on the battery type being tested. By precisely timing the duration of the resistive load, overheating and damage to the battery under test is prevented and accurate, reproducible results are ensured from test to test.

Another desirable feature for the electronic circuit is that it can be easily used by untrained operators, whereby it easily computes and displays test results as a percentage of remaining battery capacity.

It is desirable for a battery tester circuit to have a power source independent from the battery under test. This enables accurate testing and precise voltage measurement of a wide range of batteries regardless of the state of charge of the battery under test. Nevertheless, it is desirable for the battery tester circuit to maintain testing accuracy regardless of the circuit's power supply voltage.

BRIEF SUMMARY OF THE INVENTION

In a first exemplary embodiment of the invention, a method of determining remaining capacity in a battery is disclosed as including the following steps: detecting the presence of a battery within one of a plurality of specified terminals; automatically initiating a timed pulse load test on the battery upon detection in a terminal; continuously passing current from the battery through a specified resistive load for the terminal; measuring a voltage of the battery while under the resistive load; comparing the measured voltage to a discharge voltage profile of the battery; and, computing the measured voltage as a percent of remaining battery capacity.

In a second exemplary embodiment of the invention, an apparatus for determining remaining capacity in a battery is disclosed as including: a microcontroller having stored therein a plurality of battery discharge profiles; a plurality of terminals connected to the microcontroller, wherein each of the terminals is identified as being applicable for a specified battery; a resistive load associated with each terminal; and, a power supply for providing a supply voltage to operate the microcontroller. A timed pulse load test is automatically initiated by the microcontroller upon detection of a battery on any of the terminals so that current from the battery is passed through the associated resistive load. A voltage for the battery is then measured, with the measured voltage being compared to a battery discharge profile for the battery so that a remaining battery capacity is computed therefrom.

DETAILED DESCRIPTION OF THE INVENTION

Figure 1:
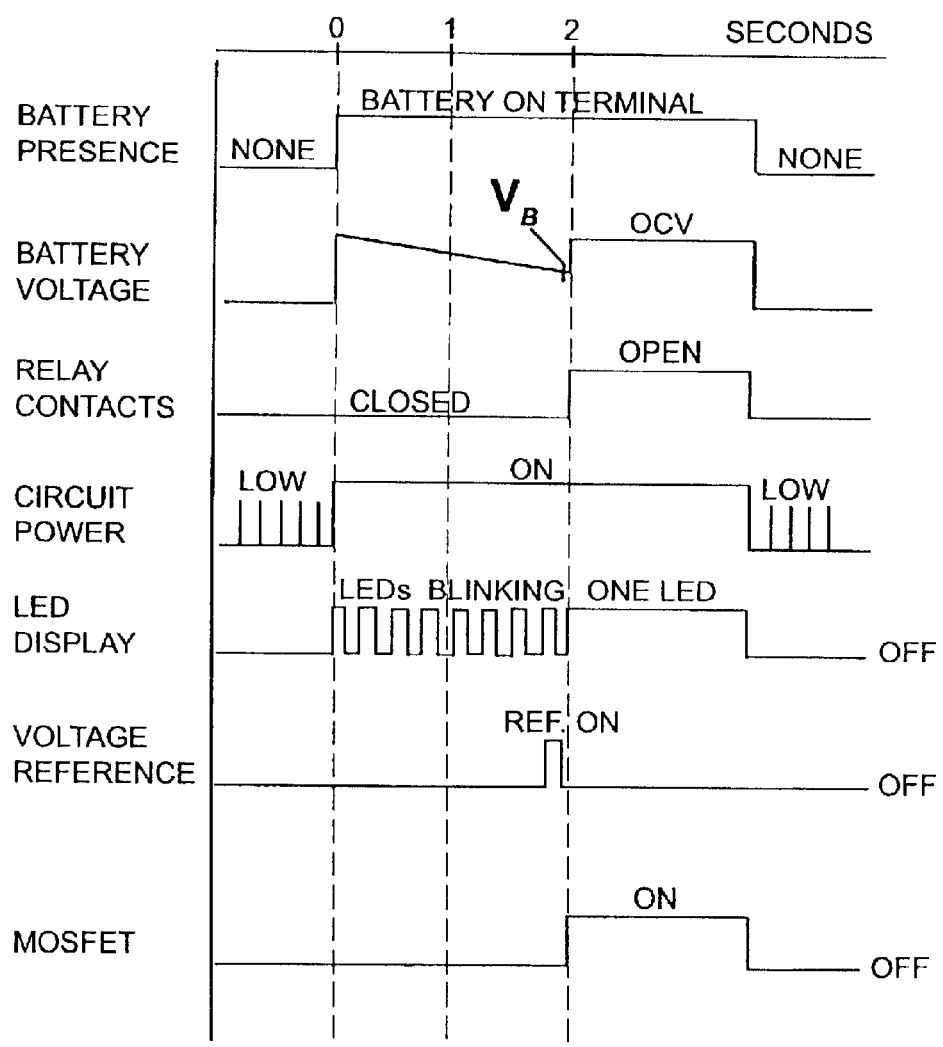
FIG. 1 is a timing diagram for a test cycle performed by the apparatus of the present invention.
Figure 2:
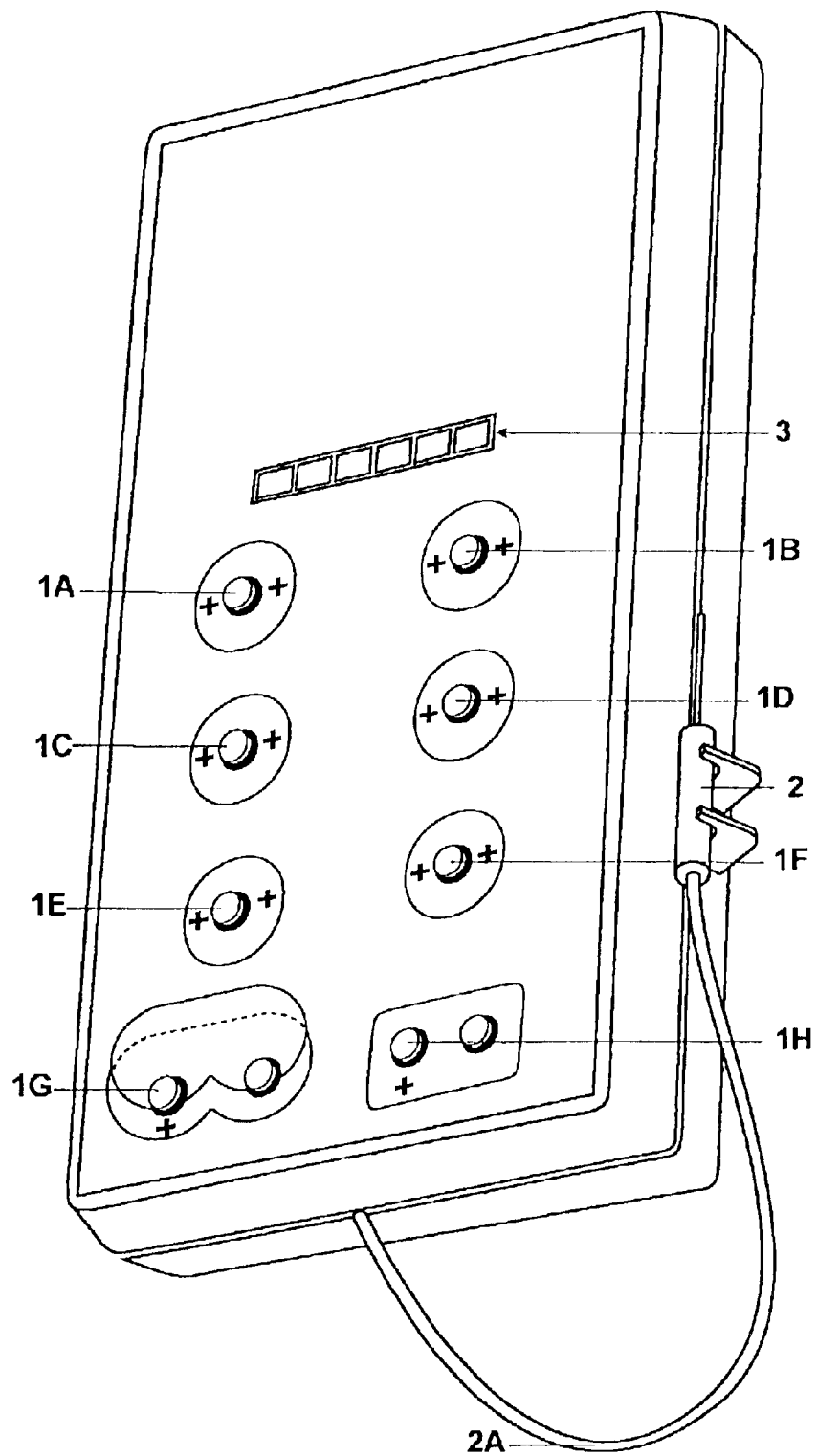
FIG. 2 is a top perspective view of the apparatus of the present invention.
Figure 3:
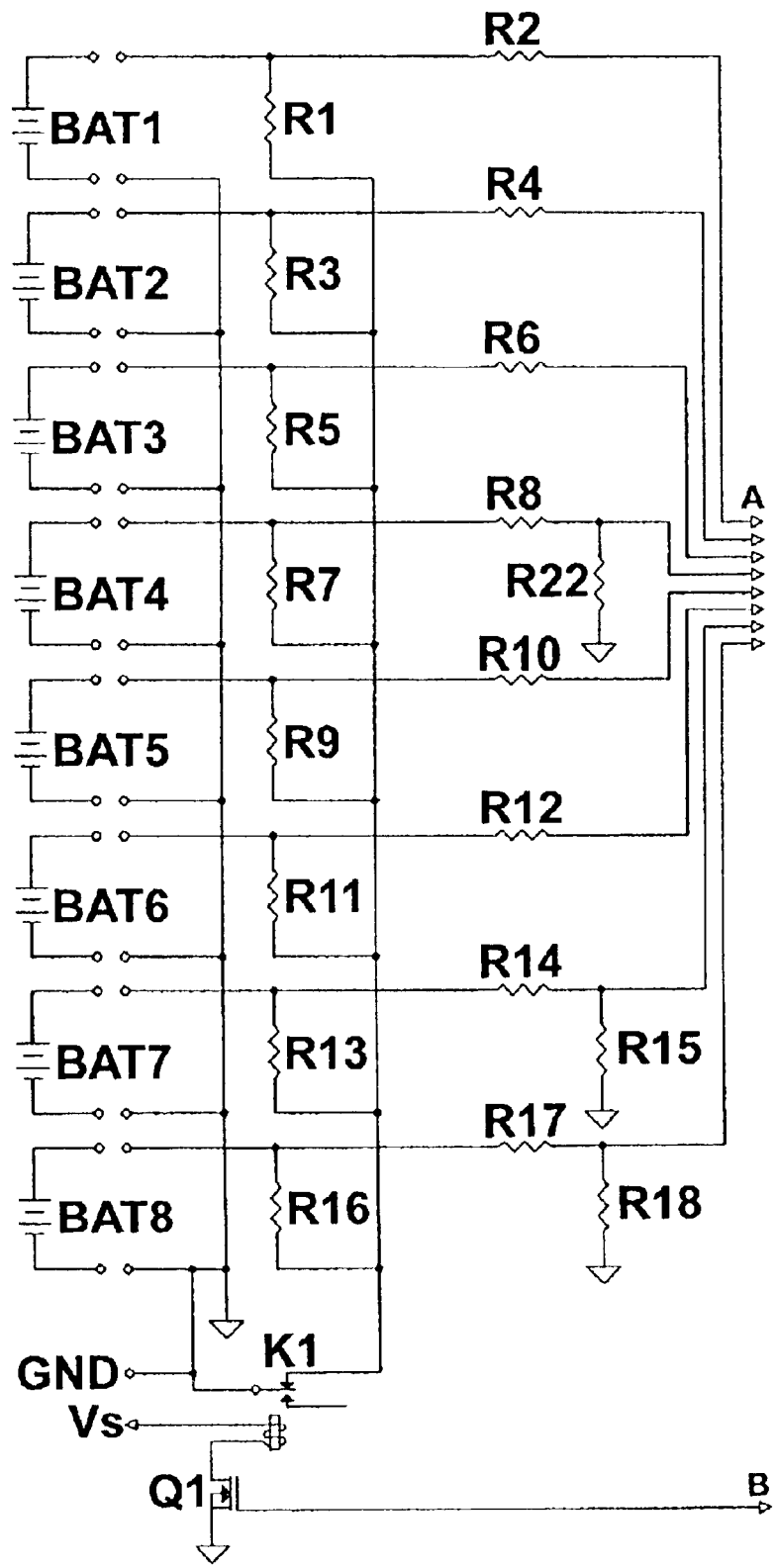
FIG. 3 is a portion of a circuit diagram for the apparatus of the present invention.
Figure 3A:
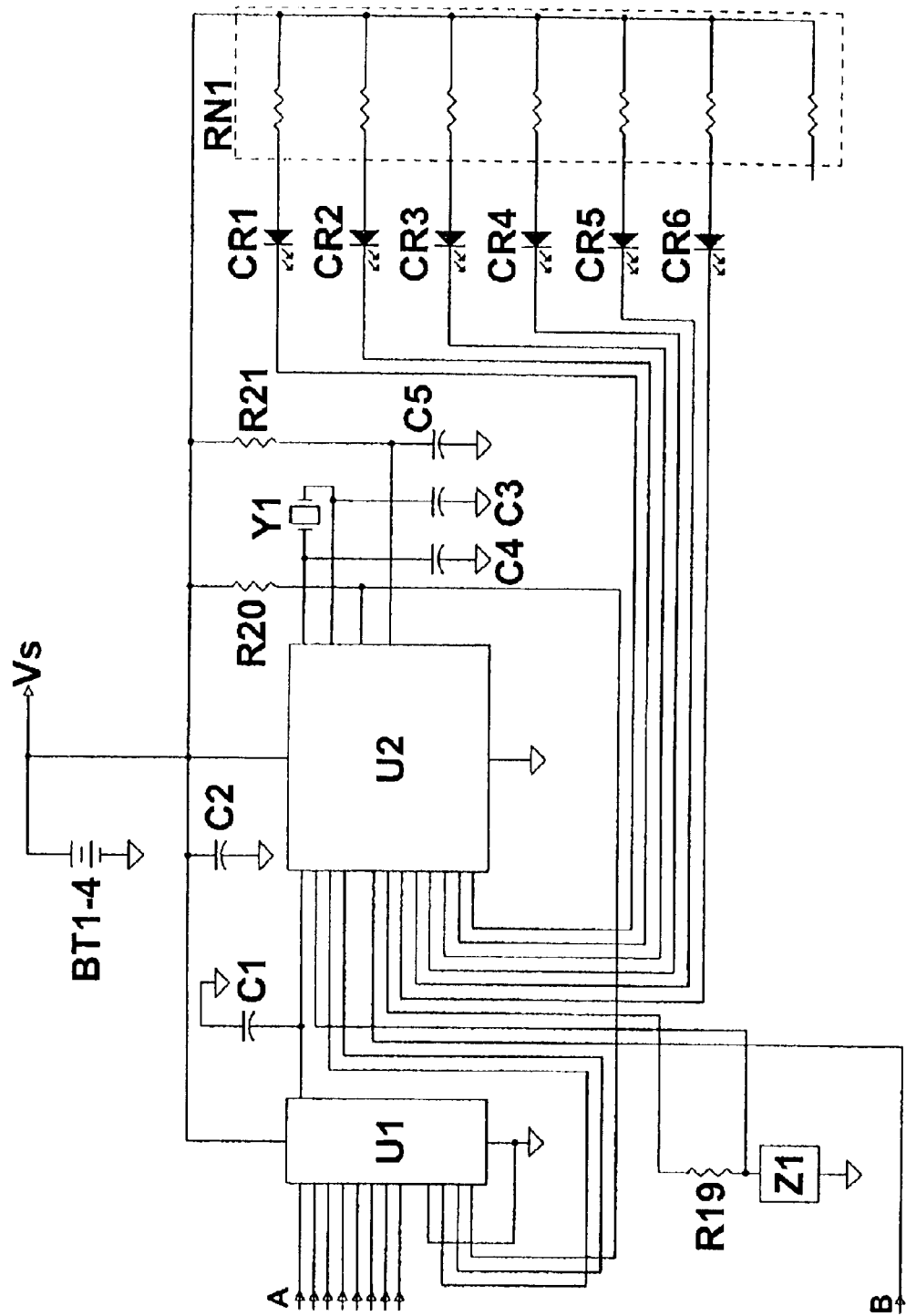
FIG. 3A is a portion of a circuit diagram for the apparatus of the present invention; and, FIG. 4 is a flow chart of the functional steps undertaken by the apparatus of the present invention.

According to the present invention, with reference to FIG. 2, FIG. 3 and FIG. 3A, the battery test circuit is based around a microcontroller U2, a single chip device which combines RAM, ROM, I/O, A/D convertor, and CPU. Like all other microprocessor based circuits, it requires certain basic support components such as an oscillator Y1 for a time base, capacitors C1, C2, C3, C4, C5, and resistors R20, R21. The circuit also includes a multiplexer U1, a relay K1, a voltage reference Z1, load resistors R1, R3, R5, R7, R9, R11, R13, R16, and six LEDs CR1, CR2, CR3, CR4, CR5, CR6 as the display 3. The colors of the LEDs in the present invention are red, yellow, and green. There are two of each color.

All terminals 1A, 1B, 1C, 1D, 1E, 1F, 1G, 1H on the present invention are for battery positive (+) and a test probe 2 connected to a wire 2A is used for battery negative (−) when necessary on cylindrical batteries. The terminals are made of brass with nickel plating, although other conductive metals such as plated copper may be used. Eighteen gauge or larger wire is used for the negative wire probe to minimize voltage variation under high current.

In the present invention, there are eight test locations for testing different battery types. These include alkaline 1.5 v, lithium 1.5 v, lithium 3 v, lithium 6 v, silver oxide 1.55 v, silver oxide 6 v, and NiMH/NlCd 1.2 v rechargeable, which together represent over 25 different individual batteries. It will be understood, however, that batteries of other chemistries and voltage size may tested at a given location.

The battery tester's circuit in the present invention preferably operates from four 1.5 volt AA size batteries BT1-4. It is understood that other power sources at higher or lower voltage may be used, and may be other than batteries, for example, an AC power adapter. There is no ON/OFF switch for or associated with the tester, instead the software algorithm instructs the microcontroller U2 to remain in a low power consumption mode while each contact terminal 1A-H is scanned in sequence through multiplexer U1, detecting for battery presence or voltage. The microcontroller U2 automatically initiates a precisely timed pulse load test when battery presence is detected on any of the tester's terminals. After each battery test, the tester's circuit preferably returns to low power consumption mode.

During the test cycle, current from the battery BAT1, BAT2, BAT3, BAT4, BAT5, BAT6, BAT7, or BAT8 passes through a corresponding precision load resistor R1, R3, R5, R7, R9, R11, R13, or R16 and then to ground through a normally closed relay K1. The value of the precision load resistors connected to each terminal depends upon the battery type. The following TABLE 1 shows the actual resistive loads used in the present invention for each aforementioned battery type, along with the corresponding reference location on FIG. 2 and FIG. 3.

It should be understood that the resistive loads used on the present invention may be altered to suit the type, size, or application of the batteries being tested. It should also be understood that both the tester's operating software and the resistive load may be altered to suit a particular testing application. It should also be understood that the pulse load tests may be single or multiple.

TABLE 1

| Battery Type | FIG. 3 | Resistor Load (Ohm) | FIG. 2 |
| --- | --- | --- | --- |
| 1.2 v NiMH, NiCd | BAT1 | 3.6 | 1A |
| 1.5 v AgO | BAT2 | 19.1 | 1B |
| 3 v lithium coin | BAT3 | 220 | 1C |
| 6 v AgO | BAT4 | 75 | 1D |
| 3 v photo lithium | BAT5 | 3.6 | 1E |
| 1.5 v alkaline | BAT6 | 9.1 | 1F |

TABLE 1-continued

| Battery Type | FIG. 3 | Resistor Load (Ohm) | FIG. 2 |
| --- | --- | --- | --- |
| 6 v photo lithium | BAT7 | 6.2 | 1G |
| 9 v alkaline | BAT8 | 220 | 1H |

A test in progress is indicated to the user by all six LEDs CR1, CR2, CR3, CR4, CR5, CR6 flashing together. The LEDs operate from the circuit's supply voltage $V_s$ through a resistor network RN1 to ground GND.

During the test, battery voltage under load $V_B$ is continuously passed through a current limiting resistor R2, R4, R6, R8, R10, R12, R14, R17 to the multiplexer U1 and from there to an in/out port of the microcontroller U2. Depending on its magnitude, battery voltage under load $V_B$ may also pass through a voltage dividing resistor R15, R18, R22 to ground GND, then to the multiplexer U1 and onto the microcontroller U2. Thus, by recognizing which terminal is being used, the correct software discharge profile for that battery is used.

In order to minimize power consumption by the battery tester's circuit and greatly extend battery life, the microcontroller U2 operates directly from the supply batteries' BT1-4 voltage, which is referred to herein as $V_s$. Alternatively, if the tester's circuit operated from a regulated voltage, for example, an in-circuit voltage regulator, the tester's internal batteries BT1-4 would have a much shorter useful life. Operating the circuit directly from the power supply batteries BT1-4 means that the A/D convertor's reference voltage necessarily changes as the supply batteries discharge with age and use, and therefore could cause erroneous test results as the supply batteries' voltage decreases over time. To maintain testing accuracy, the microcontroller U2 first measures and stores the voltage of the battery under load $V_B$ and then enables a high tolerance ±1% voltage reference and stores its voltage output $V_{REF}$. In the present invention, this reference voltage $V_{REF}$ is 2.50 volts, but that can range from 1.80 volts to 5.00 volts. At the end of each test, voltage of the battery under load $V_B$ is then scaled by using the ratio of what the A/D reference would read if it were operating on +5.00 volts $V_s$, divided by the measured precision reference value $V_{REF}$. We refer to the result as $V_{Bscaled}$. This scaling process is a preferred embodiment of the present invention, and is shown mathematically in the equation below:

$$V_{Bscaled} = [128 \times V_B] \div V_{REF}$$

Where:
$V_B$=the binary equivalent of the measured voltage of the battery under test load
$V_{REF}$=the binary equivalent of the measured precision reference voltage
128=the number of bits for a 2.5 volt reference, assuming as in the present invention a 5 volts source $V_s$ and 8-bit A/D.

The battery voltage scaling algorithm is executed approximately 50 milliseconds before the end of each pulse load test. Then, the microcontroller compares $V_{Bscaled}$ to the battery's discharge voltage profile, which is stored in the program memory. These batter discharge profiles are determined for each battery type or size by extensive testing, and are programmed into the tester's operating software. This voltage discharge data is accurate to ±10 millivolts in this device. This level of accuracy is necessary to distinguish small voltage changes associated with the relatively flat voltage discharge profiles of certain battery chemistries.

To end each test cycle, the microcontroller U2 signals a MOSFET Q1 which drives the coil of relay K1, causing the relay contacts to open. This disconnects the resistive load to prevent excessive drain of the battery being tested.

Each test result is computed as a percent of remaining battery capacity, and is displayed by illuminating one of six multi-colored LEDs. That LED will remain lighted until the user removes the battery from the test terminal.

The following TABLE 2 contains voltage profiles of three different batteries at various states of discharge. Notice the difference between open circuit voltage OCV and voltage under load $V_B$ during the test cycle. Open circuit voltage OCV is what would be measured by using a voltmeter or multimeter across the battery's terminals.

TABLE 2

| Battery | $C_{RB}$ | OCV | $V_B$ | Display 3 |
|---|---|---|---|---|
| 6 v photo | 100% | 6.31 | >5.28 | Green LED CR1 |
| lithium | 80% | 6.20 | >5.10 | Green LED CR2 |
| 1300 mAH | 60% | 6.12 | >4.82 | Yellow LED CR3 |
| capacity | 40% | 6.05 | >4.42 | Yellow LED CR4 |
| | 20% | 5.98 | >4.15 | Red LED CR5 |
| | 10% | 5.93 | >3.90 | Red LED CR6 |
| 3 v photo | 100% | 3.16 | >2.64 | Green LED CR1 |
| lithium | 80% | 3.10 | >2.55 | Green LED CR2 |
| 1300 mAH | 60% | 3.05 | >2.41 | Yellow LED CR3 |
| capacity | 40% | 2.97 | >2.21 | Yellow LED CR4 |
| | 20% | 2.89 | >2.08 | Red LED CR5 |
| | 10% | 2.82 | >1.95 | Red LED CR6 |
| 1.5 v alkaline | 100% | 1.56 | >1.44 | Green LED CR1 |
| 2600 mAH | 80% | 1.41 | >1.37 | Green LED CR2 |
| capacity | 60% | 1.35 | >1.27 | Yellow LED CR3 |
| | 40% | 1.32 | >1.17 | Yellow LED CR4 |
| | 20% | 1.28 | >1.08 | Red LED CR5 |
| | 10% | 1.24 | >0.93 | Red LED CR6 |

$C_{RB}$ = Remaining Battery Capacity
OCV = Battery Open Circuit Voltage (no load)
$V_B$ = voltage of battery under load
Display 3 = test result as indicated by the tester's LED display This shows the importance of using a load similar to those experienced by the battery during normal operating conditions. This not only establishes voltage magnitudes typical during operating conditions, but also amplifies the changes in voltage for more precise measurement. In most cases the delta, or slope of voltage change, is greater under load than is the delta for open circuit voltage. It should be noted that remaining battery capacity may be determined from the voltage delta during one or more pulse load tests as well as absolute voltage values.

Figure 4:
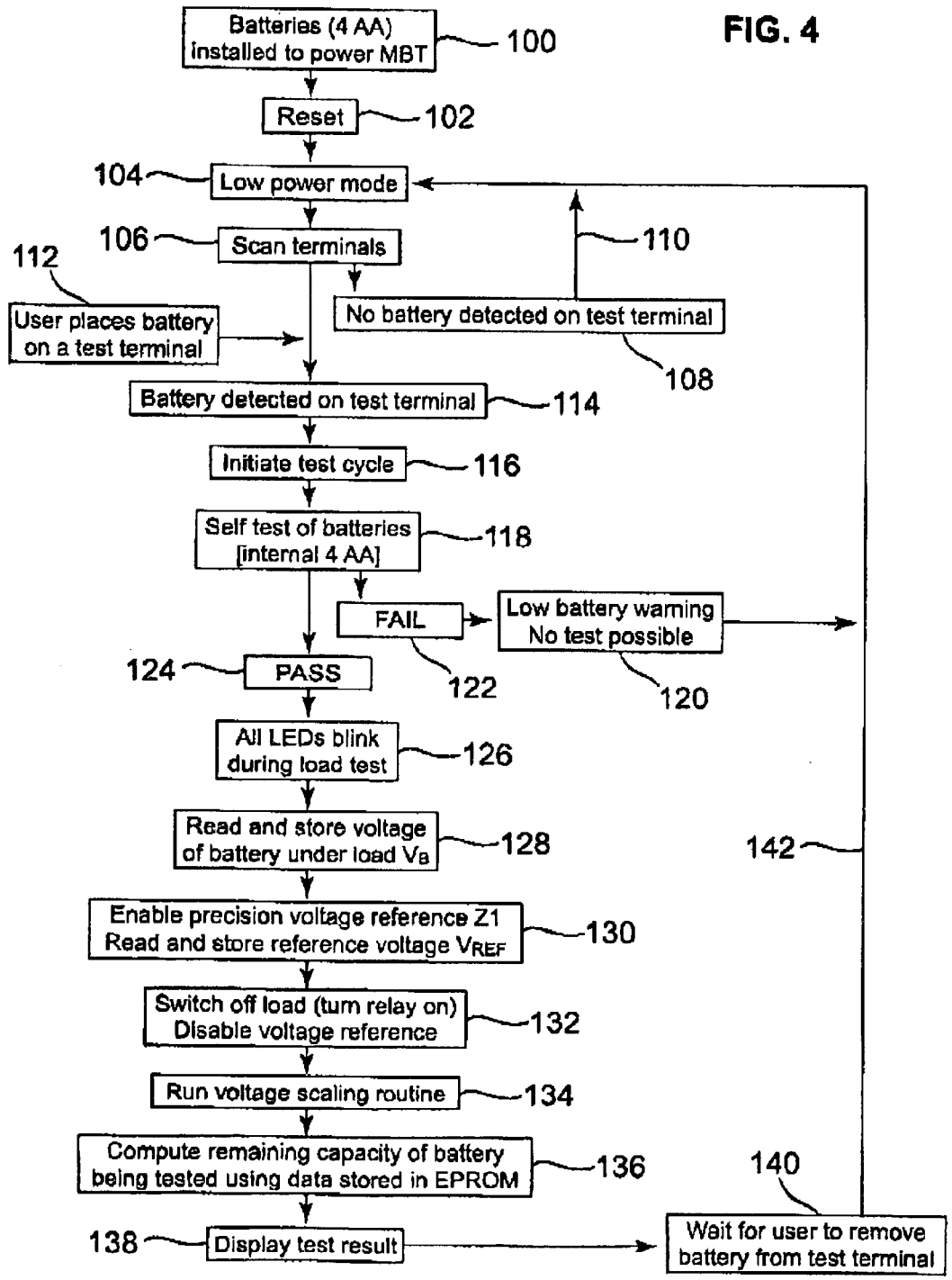

In order to better appreciate the operation of the tester described herein, FIG. 4 depicts a flow chart of the functional steps undertaken. As seen therein, a first box 100 indicates that supply batteries BT1-4 are installed in order to provide supply voltage $V_S$ for powering the tester. The tester is then reset (box 102) so that the tester is placed in a low power mode (box 104). Thereafter, multiplexer U1 scans terminals 1A–1H in sequence to determine whether a battery or voltage is detected (box 106). If no battery is detected (box 108), then a feedback loop 110 returns to low power mode in box 104 and begins again. On the other hand, if a user places a battery on one of test terminals 1A–1H (box 112), the battery is detected (box 114) and a test cycle is initiated by microcontroller U2 (box 116).

The tester then undertakes a self test of batteries BT1-4 (box 118), whereupon a low battery warning is provided (box 120) if the test fails (box 122). Provided the test passes (box 124), a signal in the form of LEDs CR1–CR6 then blink during the load test (box 126). During the pulse load test, voltage of the battery under load $V_B$ is read and stored (box 128). The voltage reference Z1 is then enabled and the reference voltage $V_{REF}$ is also read and stored (box 130).

Once the reference voltage $V_{REF}$ has been stored, relay K1 is turned on and the load is switched off (box 132). In this way, voltage reference Z1 is disabled. The voltage scaling routing described herein is then run (box 134) and the remaining capacity of the battery $C_{RB}$ being tested is computed by utilizing the discharge profile stored in microcontroller U2 (box 136). The remaining battery capacity $C_{RB}$ is then preferably displayed utilizing the LEDs CR1–CR6 (box 138). After the user removes the battery from the test terminal (box 140), a feedback loop 142 returns the tester to the low power mode (box 104).

It is understood that modifications of the invention may be made by persons skilled in the field. Therefore, the embodiments shown in the preceding detailed description and drawings are for illustration purposes only, and are not intended to limit the scope of the invention.

What is claimed is:

1. A method of determining remaining capacity in a battery, comprising the following steps:

(a) detecting the presence of a battery within one of a plurality of specified terminals;

(b) automatically initiating a timed pulse load test on said battery upon detection in a terminal;

(c) continuously passing current from said battery through a specified resistive load for said terminal;

(d) measuring a voltage of said battery while under said resistive load;

(e) comparing said measured voltage to a discharge voltage profile of said battery; and, (f) computing said measured voltage as a percent of remaining battery capacity.

2. The method of claim 1, further comprising the step of scaling said measured voltage as a function of a measured reference voltage to a supply voltage.

3. The method of claim 1, further comprising the step of identifying said battery from said terminal.

4. The method of claim 1, further comprising the step of identifying a test in progress.

5. The method of claim 1, further comprising the step of scanning said terminals in sequence to detect the presence of a battery therein.

6. The method of claim 1, wherein said specified resistive load is in accordance with a type of said battery detected in said terminal.

7. The method of claim 1, wherein said specified resistive load is in accordance with a size of said battery detected in said terminal.

8. The method of claim 1, wherein said specified resistive load is in accordance with an application for said battery detected in said terminal.

9. The method of claim 1, wherein a single pulse load test is conducted.

10. The method of claim 1, wherein multiple pulse load tests are conducted.

11. The method of claim 1, further comprising the step of passing said current of said battery through a voltage dividing resistor prior to said measuring step when said measured voltage is greater than a predetermined level.

12. The method of claim 1, wherein said discharge voltage profile is a function of said terminal.

13. The method of claim 1, further comprising the step of operating said timed pulse load test directly via a supply voltage from a plurality of supply batteries.

14. The method of claim 13, further comprising the following steps:

(a) enabling a high tolerance voltage reference;

(b) storing a voltage output from said voltage reference; and, (c) scaling said measured voltage as a function of said supply voltage and said reference voltage.

15. The method of claim 1, further comprising the step of storing a discharge voltage profile for a battery associated with each terminal.

16. The method of claim 1, further comprising the step of displaying a signal indicative of said computed remaining battery capacity.

17. The method of claim 1, wherein said remaining battery capacity is computed as a function of a change in voltage for said battery during said pulse load test.

18. The method of claim 1, further comprising the step of disconnecting said specified resistive load upon completion of said pulse load test.

19. The method of claim 1, wherein said specified resistive load is substantially similar to a load experienced by said battery operating under normal conditions.

20. An apparatus for determining remaining capacity in a battery, comprising:

(a) a microcontroller having a plurality of battery discharge profiles stored therein;

(b) a plurality of terminals connected to said microcontroller, wherein each of said terminals is identified as being applicable for a specified battery;

(c) a resistive load associated with each terminal;

(d) a power supply for providing a supply voltage to operate said microcontroller;

wherein a timed pulse load test is automatically initiated by said microcontroller upon detection of a battery on any of said terminals so that current from said battery is passed through said associated resistive load and a voltage for said battery is measured, said measured voltage being compared to a battery discharge profile for said battery and a remaining battery capacity being computed therefrom.

21. The apparatus of claim 20, further comprising a multiplexer for scanning said terminals in sequence for the presence of a battery.

22. The apparatus of claim 20, further comprising a plurality of light emitting diodes to indicate a corresponding remaining capacity for said battery computed by said microcontroller.

23. The apparatus of claim 20, further comprising a voltage reference for providing a measured reference voltage, wherein said measured voltage of said battery is scaled by comparing said measured reference voltage and said supply voltage.

24. The apparatus of claim 20, wherein said resistive load is a function of the type of said battery specified for said terminal.

25. The apparatus of claim 20, wherein said resistive load is a function of the size of said battery specified for said terminal.

26. The apparatus of claim 20, wherein said resistive load is a function of an application for said battery specified for said terminal.

27. The apparatus of claim 20, wherein said microcontroller initiates a plurality of timed pulse load tests on said battery.

28. The apparatus of claim 20, further comprising a voltage divider for reducing said measured voltage when above a specified level.

29. The apparatus of claim 20, further comprising a current limiting resistor located between each said terminal and said microcontroller.

30. The apparatus of claim 20, further comprising a relay connected to each terminal and ground, wherein the connection of said resistive load to said battery is controlled thereby.

* * * * *